United States Patent [19]

Israelsen et al.

[11] Patent Number: 5,124,791

[45] Date of Patent: Jun. 23, 1992

[54] FRAME-TO-FRAME COMPRESSION OF VECTOR QUANTIZED SIGNALS AND OTHER POST-PROCESSING

[75] Inventors: Paul D. Israelsen; Richard W. Harris, both of Logan, Utah

[73] Assignee: Utah State University Foundation, Logan, Utah

[21] Appl. No.: 359,496

[22] Filed: May 31, 1989

[51] Int. Cl.⁵ .............................................. H04N 7/13
[52] U.S. Cl. .................................. 358/136; 375/122; 341/106; 358/135
[58] Field of Search ............... 358/135, 136, 133, 105, 358/261.1, 261.3, 426, 432; 341/106, 65; 364/570; 375/122, 27, 30; 382/56; 370/118; 381/30, 31

[56] References Cited

U.S. PATENT DOCUMENTS

| | | | |
|---|---|---|---|
| 3,717,851 | 2/1973 | Cooke et al. | 341/106 X |
| 4,420,771 | 12/1983 | Pirsch | 341/106 X |
| 4,718,087 | 1/1988 | Papamichalis | 281/31 X |
| 4,791,654 | 12/1988 | DeMarca et al. | 375/122 |
| 4,811,265 | 3/1989 | Hashimoto et al. | 341/106 X |
| 4,813,056 | 3/1989 | Fedek | 375/27 |
| 4,837,632 | 6/1989 | Kabo et al. | 358/222 |
| 4,847,619 | 7/1989 | Kato et al. | 341/106 |
| 4,853,779 | 8/1989 | Hammer et al. | 358/135 X |
| 4,878,230 | 10/1989 | Murakami et al. | 375/27 |
| 4,899,148 | 2/1990 | Sato et al. | 358/261.3 X |
| 4,907,276 | 3/1990 | Aldersberg | 381/31 X |

OTHER PUBLICATIONS

Ziv et al., IEEE Transactions, May 1977 entitled of "Universal Algorithm for Sequential Data Compression."

J. P. Storer text entitled "Data Compression Methods and Theory" Computer Science Press 1988, pp. 39–45.

*Primary Examiner*—Victor R. Kostak
*Attorney, Agent, or Firm*—Venable, Baetjer and Howard

[57] ABSTRACT

Post-quantization processing is disclosed in which frames of data are organized into frames of input vectors. For each input vector, the quantizer identifiers a closely matching codebook vector. The quantizer generates a compressed signal by replacing each input vector in a frame with an ID code of a closely matching codebook vector. On subsequent frames, the quantizer further processes ID codes to achieve additional compression. In one embodiment, the ID codes from one frame are compared to the corresponding ID codes in the previous frames. If the ID code from the subsequent frame (new ID code) is the same as the corresponding ID code from the previous frame (old ID code), the new ID code is eliminated from the frame and a tag bit is set to indicate that the ID Code was eliminated. Similarly, if the new ID code represents a vector which is only slightly different from the vector represented by the old ID code, the new ID code is replaced with a tag bit. In this way, transmission of the subsequent frames requires only the transmission of vectors which differ by a significant amount from the prior frame. In other embodiments, other post processing methods are used. For example, lossless coding techniques, such as the socalled Lempel-Ziv and Huffman codes are discussed.

19 Claims, 8 Drawing Sheets

FRAME-TO-FRAME COMPRESSION OF VECTOR QUANTIZED SIGNALS AND OTHER POST-PROCESSING

BACKGROUND OF THE INVENTION

This invention relates to a method and apparatus for compressing data. More specifically, this invention relates to post-processing of vector quantized signals.

Vector quantization is a data compression technique. A data signal to be compressed is expressed as a series of input vectors where each vector is an ordered set of individual data elements. A quantizer compares each input vector to a set of codebook vectors and identifies one closely matching codebook vector. The quantizer then generates a new signal consisting of the series ID codes (sometimes referred to as addresses) for the codebook vectors which matched the input vectors. In order to utilize clear terminology, data in its form before quantization shall be designated as information in the raw data domain, and ID codes shall be designated as information in the codebook domain.

The computational complexity of prior vector quantizers has created a perception that raw data must be heavily processed before quantization. This preprocessing is believed to reduce the workload on the vector quantizer, and make vector quantization a practicable compression technique. For example, Murakami et. al. U.S. Pat. No. 4,710,812 performs numerous operations on information before the quantization step. A mean value separation circuit normalizes vectors by subtracting the mean value of scalars in a vector from each and every scalar. Additionally, the apparatus computes an inner product between raw data vectors from successive frames to detect changes. These operations are performed on vectors in the raw data domain. The article entitled "Vector Predictive Coding of Speech at 16 Kbits/s" by Cupperman and Gersho, *IEEE Transactions on Communications.* vol. COM-33, No. 7, Jul. 1985 provides another example. A predictive coder operates on information in the raw data domain to generate a prediction of the next raw data vector in a series. The prediction is subtracted from the actual vector when it arrives, and only the difference is quantized. Conventional vector quantizer systems virtually ignore processing in the codebook domain.

SUMMARY OF THE INVENTION

The present inventional comprises a technique for post-quantization processing. A quantizer is disclosed which organizes frames of data into frames of input vectors. For each input vector, the quantizer identifies a closely matching codebook vector. The quantizer generates a compressed signal by replacing each input vector in a frame with an ID code of a closely matching codebook vector.

On subsequent frames, the quantizer further processes ID codes to achieve additional compression. In one embodiment, the ID codes from one frame are compared to the corresponding ID codes in the previous frames. If the ID code from the subsequent frame (new ID code) is the same as the corresponding ID code from the previous frame (old ID code), the new ID code is eliminated from the frame. A "no change identifier" (called a "tag bit") is set to indicate that the ID Code was eliminated. Similarly, if the new ID code represents a vector which is only slightly different from the vector represented by the old ID code, the new ID code is replaced with a tag bit. In this way, transmission of the subsequent frames requires only the transmission of vectors which differ by a significant amount from the prior frame.

In other embodiments, other post processing methods are used. For example, lossless coding techniques, such as the so-called Lempel-Ziv and Huffman codes are discussed.

DESCRIPTION OF THE PREFERRED EMBODIMENT

The preferred embodiment shall be described with particular reference to video images, but such an application is not a limitation on its scope. All applications of vector quantizers can benefit from the present invention.

Stated briefly, the quantizer organizes each video frame into a series of image vectors. For each image vector, the quantizer identifies a closely matching codebook vector and replaces each input vector with an ID code of the matching codebook vector. The quantizer compares ID codes from one frame to the corresponding ID codes in the previous frames. If the ID code from the subsequent frame (new ID code) is the same as the corresponding ID code from the previous frame (old ID code), the new ID code is eliminated from the series. A "tag bit" is set to indicate that the ID Code was eliminated. Similarly, if the new ID code represents a vector which is only slightly different from the vector represented by the old ID code, the new ID code is eliminated.

Figure 1:
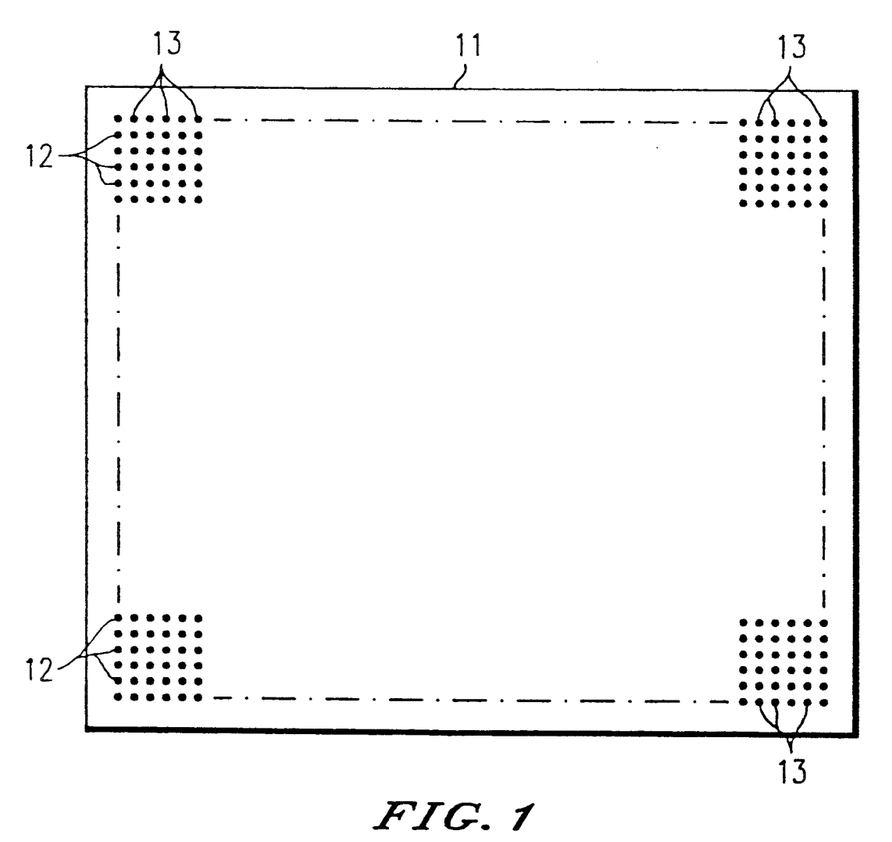
FIG. 1 is graphic representation of the organization of an image into an array of pixels.

FIG. 1 shows a conceptual representation of a frame 11 of video data. The frame 11 may be a two dimensional image formed by a video camera which has scanned a scene in the well known raster pattern. As an example, the image may be divided into an array of six hundred rows 12 with six hundred pixels 13 per row 12. For a black and white image, one pixel describes the intensity of the image at that location. For a color signal, three pixels are used: one pixel for each of the Y, I and Q components of the signal. Other data signals, such as audio signals or radar signatures may serve as data sources.

Figure 2:
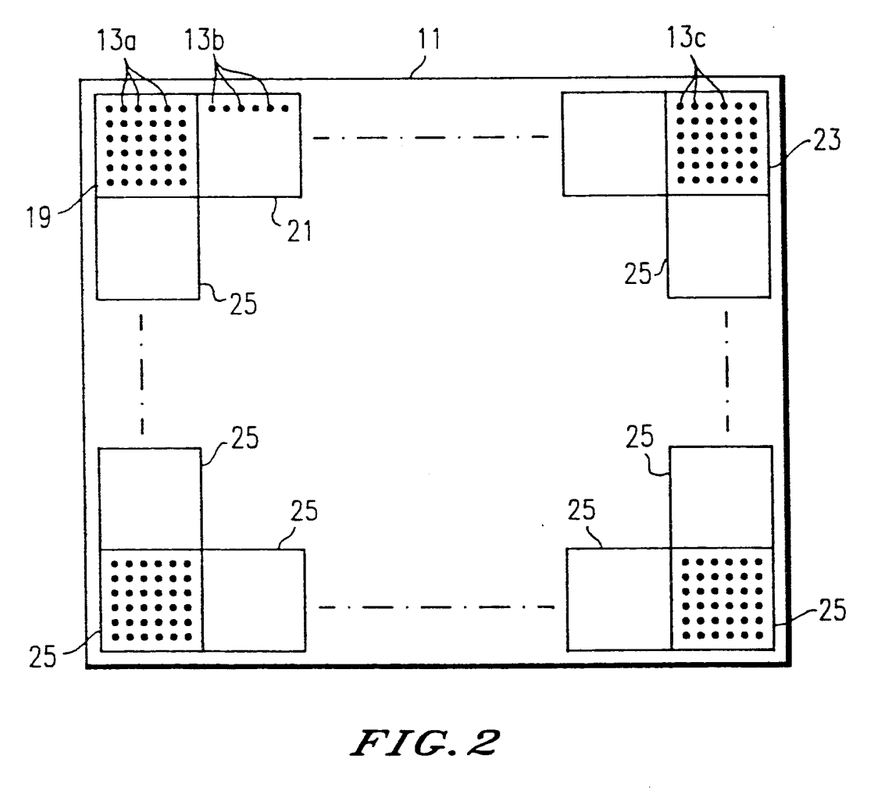
FIG. 2 is a graphic representation of the organization of an image into an array of vectors.

The quantizer organizes each video frame into a series of input vectors. FIG. 2 shows such a frame. Contiguous 6×6 blocks of thirty six pixels 13 are grouped into vectors 19, 21, 23, 25. For example, the first six pixels 13 (starting from the left) of the first six rows 12 (starting from the top) constitute one vector 19. The next 6×6 block of pixels 13b from the top six rows 12 constitute a second vector 21, and the last 6×6 block of pixels 13 from the top six rows 12 constitute a vector 23. Subsequent rows are similarly organized into additional vectors 25. There are six hundred pixels 13 in a row 12, thus, the top six rows are divided into one-hundred vectors. There are six hundred rows 12 of pixels per frame, thus there are 100 rows of vectors per frame. The image is thus organized into 100 rows with 100 image vectors per row. A frame can thus be represented as a series of 10,000 input vectors.

For each input vector, the quantizer (not shown) identifies a closely matching codebook vector. Codebook vectors are generic, and the codebook is designed so that at least one codebook vector can be found which will be a reasonably close match to any input vector. Various methods for generating codebook vectors exist, such as one described in the article by Y. Linde, A.Buzo and R. Gray entitled "*An Algorithm for Vector Quantizer Design,*" IEEE Transactions on Communications, Vol. Com-2B, No. 1 (Jan. 1980), A one-to-one logical correspondence exists between vectors in each frame. For example, the first six pixels 13 (starting from the left) of the first six rows 12 (starting from the top) of the first frame in a series of frames constitute a vector. Similarly, the first six pixels 13 in the first six rows 12 of the second frame constitute a vector. The spatial area covered by the first vector of the first frame corresponds exactly to the spatial area covered by the first vector in each subsequent frame. The logical correspondence is spatial area. Other logical correspondence relationships may also be used.

The quantizer compares ID codes from one frame (referred to as the "new" frame) to the corresponding ID code of the prior frame (referred to as the "old" frame). If an ID code from the new frame is the same as the corresponding ID code from the old frame, the ID code from the new frame is eliminated from the series. A "tag bit" in the data stream is set to indicate that a vector has been eliminated. Consider, for example, a first frame which has been quantized to form a first series of ID codes:

$\{F_1(1), F_2(1) \ldots F_{1,000}(1)\}$ where "F" designates an ID code, the subscript designates the position of the ID code in the series for a particular frame, and the number in parenthesis designates the frame number. Consider also a second frame which has been quantized to form a second series of ID codes:

$\{F_1(2), F_2(2), \ldots, F_{10,000}(2)\}$.

The quantizer compares the first ID code from the first frame $F_1(1)$ to the first ID code from the second frame $F_1(2)$. If the two codes are the same, the ID code from the second frame $F_1(2)$ can be eliminated.

Figure 3:
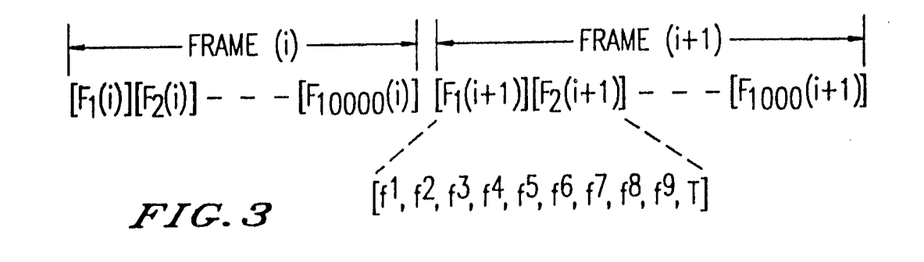
FIG. 3 is an algebraic representation of ID codes organized into frames.

FIG. 3 shows an algebraic representation of the format of the output from a vector quantizer (not shown) before interframe compression. The output is a series of frames Frame(i), Frame(i+1), ..., where each frame is a series of identification codes $F_1(i)$, $F_2(i)$, ... Each identification code is an exemplary ten bit binary number $f^1, \ldots, f^{10}$ followed by a tag bit T.

Figure 4:
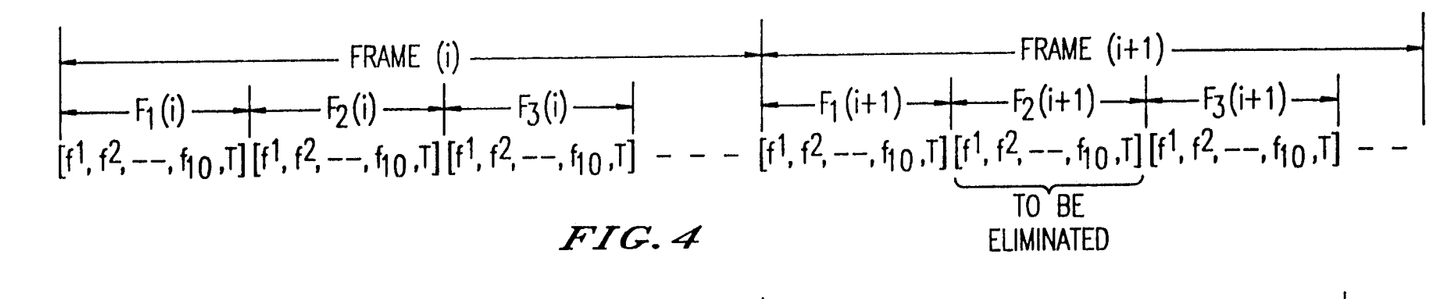
FIG. 4 is an algebraic representation of corresponding portions of two frames of ID codes.

FIG. 4 shows an algebraic representation of the output from a vector quantizer (not shown) with ID codes. The second ID code of the second frame $F_2(i+1)$ is identified as one which will be eliminated during interframe compression.

Figure 5:
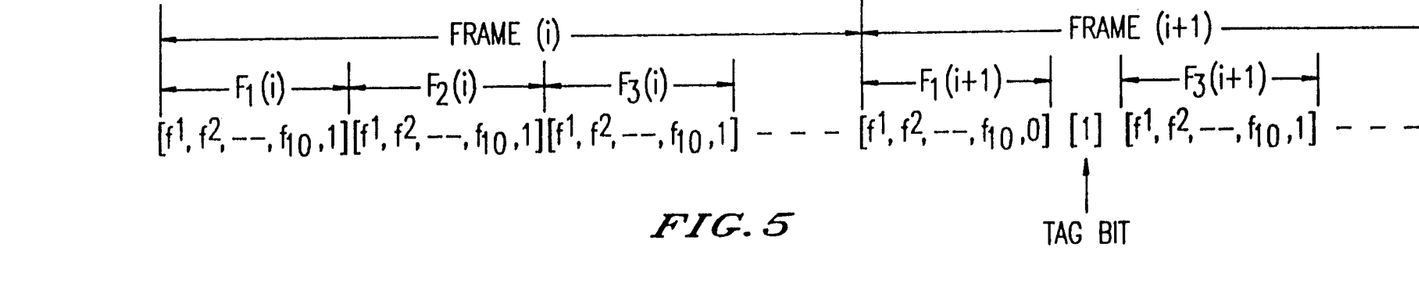
FIG. 5 is an algebraic representation of two frames of ID codes from which one code has been eliminated by interframe compression.

FIG. 5 shows an algebraic representation of the output from an interframe compressor (not shown). The tag bit T of the first ID code of the second frame $F_1(2)$ has been set to "0" to indicate that the following ID code $F_2(2)$ has been deleted. The ten bits of the second ID code of the second frame $F_2(2)$ (having been deleted) are not shown, but the tag bit T remains. The tag bit T of the second ID code of the second frame $F_2(2)$ is set to "1" to indicate that the next ten bits are an ID code which has not been deleted by interframe compression.

An ID code may also be eliminated if the underlying vectors differ by an insignificant amount (rather than being identical). The difference $d(F_n(i), F_n(i+1))$ between two vectors can be defined mathematically and computed quantitatively. For example, distance can be defined as a scaler which is the norm of the difference between the two vectors. For the purpose of this discussion, the norm is taken as the square root of the sum of the squares of the differences of the scaler elements of the vectors. For two dimensional vectors, distance could be written as:

$$d(A,B) = \|A - B\| = \sqrt{(a_1 - b_1)^2 + (a_2 - b_2)^2}$$

A and B are vectors, (such as $F_n(i)$ and $F_n(i+1)$); $d(F_n(i), F_n(i+1))$ is the distance measure; $a_1$ and $a_2$ are scalar elements of the vector A; $b_1$ and $b_2$ are scalar elements of the vector B; and double Vertical bars represent the norm of a vector.

In order to facilitate processing, a matrix of distances can be formed. Table I shows the organization of such a matrix.

TABLE I

| 0 | $d(A_1,A_2)$ | $d(A_1,A_3)$ | — | $d(A_1,A_m)$ |
|---|---|---|---|---|
| $d(A_2,A_1)$ | 0 | $d(A_2,A_3)$ | — | $d(A_2,A_m)$ |
| $d(A_3,A_1)$ | $d(A_3,A_2)$ | 0 | — | $d(A_3,A_m)$ |
| . | . | . | | . |
| . | . | . | | . |
| $d(A_m,A_1)$ | $d(A_m,A_2)$ | $d(A_m,A_3)$ | — | 0 |

Each row of the matrix corresponds to one codebook vector $A_j$. Each column of the matrix also corresponds to one codebook vector $A_j$. The entries in the matrix are the distances $d(A_i,A_j)$ between codebook vectors. Suppose, for example, that there are 1,024 vectors in the codebook. There would be 1,024 rows and 1,024 columns in the matrix. The entry in the first column of the first row is the distance between $A_1$ and itself, which is zero. The entry in the second column of the first row is the distance between $A_1$ and $A_2$, which is given by the symbol $d(A_1,A_2)$. The entry in the last column first row is the distance between $A_1$ and $A_{1024}$. The second row of the matrix contains the distances between the second codebook vector $A_2$ and all other codebook vectors.

The matrix of Table I can be stored in memory, and distances between corresponding vectors of successive frames can be determined by retrieving them from memory, since the table is indexed by ID Code. In this way, ID codes can be processed in the codebook domain without the need to perform computations in the raw data domain. Also, from the table it can be appreciated that the distance $d(A_1,A_2)$ is the same as $d(A_2,A_1)$. Accordingly, it is necessary to store only half of the table in memory.

When a series of frames is compressed, a large number of frames may pass with little or no change to certain spatial areas. If, for example, the top rows of an image of sky remain unchanged while action occurs in the bottom half of the scene, ID codes for upper vectors may all be eliminated, and tag bits set to "0." In order to detect a change when it does occur, a memory stores the most recently transmitted ID codes for the full frame. New ID codes are compared to the last corresponding ID code from a previous frame which was not replaced with a tag bit.

Variations on this basic method exist which do not alter the fundamental approach. For example, the number of new vectors sent in a frame may be a fixed number N. Each frame is analyzed to determine the N vectors with the most distortion. Only the N most distorted vectors are transmitted. In this way, a fixed transmission rate can be achieved while minimizing the distortion at that transmission rate.

Figure 6:
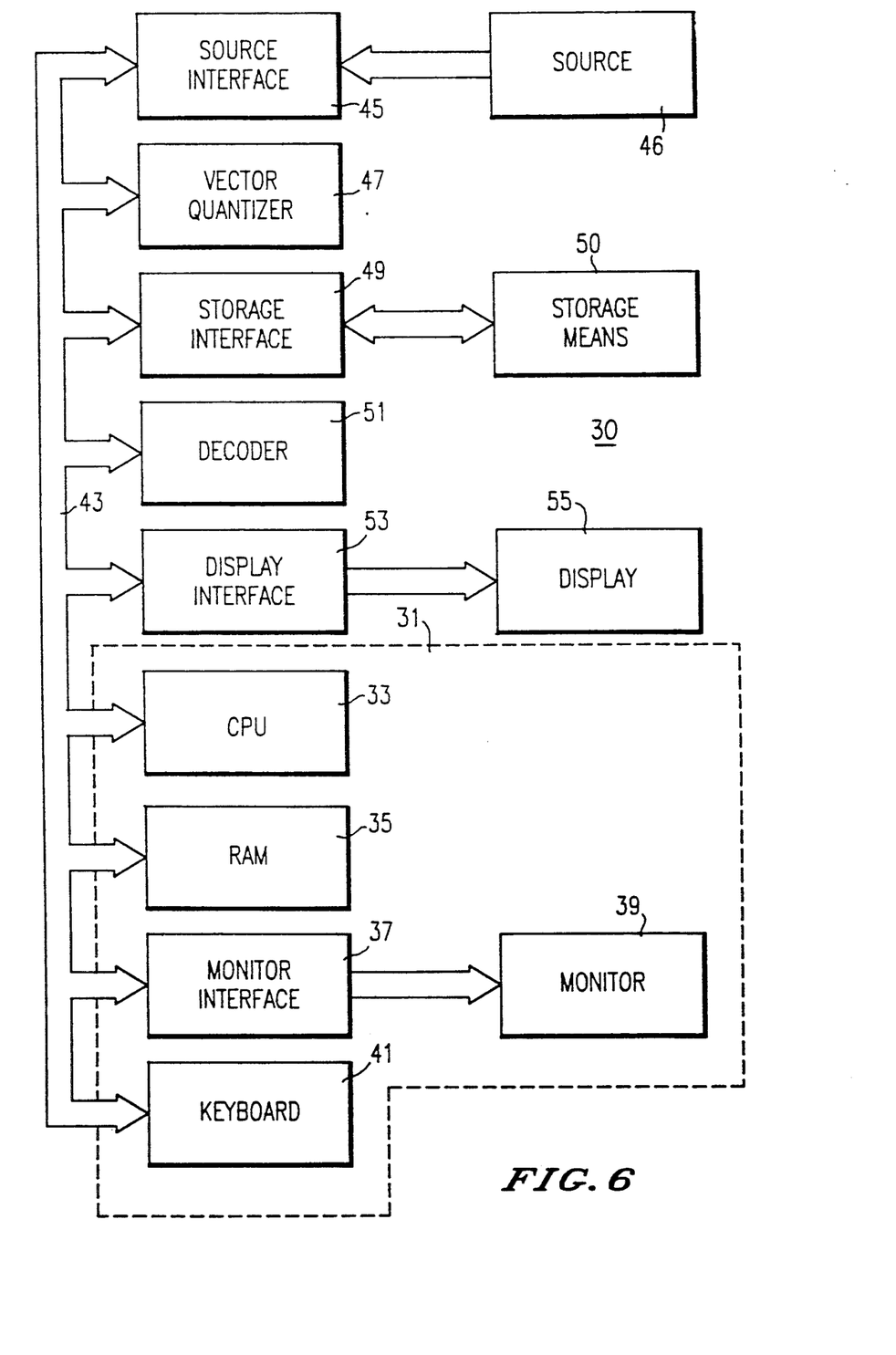
FIG. 6 is a schematic block diagram of an apparatus for compressing data in accordance with the present invention.

FIG. 6 shows a schematic block diagram of a system 30 for compressing data in accordance with the present invention. The system 30 includes, as a core, a computer 31 which may be an 4/110 model computer manufactured by Sun Corporation. The computer includes a central processing unit (CPU) 33, thirty two (32) megabytes of random access memory (RAM) 35, a monitor interface 37, a monitor (39) and a keyboard 41. These items are well known, and no further discussion is necessary.

The core computer 31 serves as a host for additional functional elements which may be in the form of expansion cards attached to the computer bus 43. These additional items include a data source interface 45 to which a data source 46 attaches, a vector quantizer 47, a storage interface 49 to which a 1 gigabyte storage means 50 attaches, a decoder 51, and a display interface 53 to which a display 55 attaches.

Image data originates from a source 46 which may be a color video camera. The source generates an analog video signal which consists of the Y, I and Q components of the raster pattern formed when the camera scans a scene. Y,I, and Q components are linear combinations of the red, blue, and green components of the color signal. Y is chosen so that it, alone, is equivalent to a black-and-white picture signal. The I and Q channels are mutually orthogonal to each other and to the Y signal, and they provide color information. The raster scan repeats according to the well known interlace pattern. The source interface 45 samples the analog video signal and generates digital pixel values which are also organized as a series of frames. It is to be understood that other known color coordinate systems such as RGB, YUV and LAB etc. may be processed in accordance with the teachings of the present invention.

The vector quantizer 47 contains stored codebook vectors selected during the design of the quantizer. The vector quantizer 47 receives the series of pixel values from the source interface 49, organizes them into image vectors, selects the codebook vector which is the best match for each image vector, and then generates an output signal consisting of a series of ID codes for the selected codebook vectors.

A copending patent application in the names of Bi et al. entitled "A Full Search Equivalent Method for Matching Data and a Vector Quantizer Utilizing Such a Method," Ser. No. 363,554, filed Jun. 9, 1989 and commonly assigned to Utah State University Foundation, the assignee herein, shows one method for quantizing vectors and is incorporated herein by reference. Stated briefly, the copending application shows a method for searching a set of codebook vectors in order to find one codebook vector which most closely matches an input vector. A reference codebook vector is identified whose magnitude most nearly equals the magnitude of the input vector. The distance between the reference codebook vector and the input vector is computed. A subset of codebook vector is formed in which the distance between each codebook vector in the subset and the reference codebook vector is less than twice the distance between the input vector and the reference codebook vector. The subset of codebook vectors is searched to identify the one codebook vector of the subset whose distance to the input vector is a minimum.

For ease of reference, the method described above shall be referred to as a "neighborhood search method," and the search shall be considered to comprise the steps of:

(a) indentifying a reference codebook vector, $A_j$, which satisfies a first criterion, (b) identifying a subset, S, of codebook vectors for which the distance between the reference codebook vector, $A_j$, and each codebook vector of the subset S satisfies a second criterion, (c) selecting a codebook vector from the subset S which closely matches the input vector.

A copending application in the name of Israelsen entitled "Vector Quantizer Codebook Processing Circuit," Ser. No. 07/333,976 filed Apr. 6, 1989 and commonly assigned to Utah State University Foundation, the assignee herein, shows another method for quantizing vectors and is incorporated herein by reference. Stated briefly, a vector quantizing circuit compares input vectors to codebook vectors. Processors simultaneously compute the distances between the input vectors and the codebook vectors. Selection circuitry compares the distance values and generates outputs which represent the codebook vector having the smallest distance and the distance itself.

For ease of reference, the method described above shall be considered to comprise the steps of:

(a) simultaneously computing distance values between an input vector and a plurality of codebook vectors, and (b) identifying the smallest distance value.

The storage interface 49 controls the storage of the compressed signal (ID codes) in the storage means 50. The storage means 50 may be any of many well known storage media, such as hard disk memory. The storage interface 49 may simply be a hard disk controller.

In order to regenerate the compressed signal after storage, the decoder 51 replaces the ID codes with the pixel values of the associated codebook vectors. The decoder 51 has stored a set of codebook vectors which are identical to the set used to quantize the original image vectors. The decoder 51 generates an output which is a series of pixel values in raster scan sequence.

The decoder 51 transfers digital pixel values to a display interface 53. The display interface 53 converts the digital signal to an analog signal in a form compatible with the final display device 55. The display interface 53, in essence, performs the digital to analog conversion and regenerates a video signal. The display interface 53 may also include memory for storing pixel values and displaying them using well known "bit map" techniques.

When quantizing a signal without frame-to-frame compression, each vector in each frame is replaced by an ID code, and a full set of ID codes would be stored in the storage means 50. Frame-to-frame compression (also called "interframe" compression) is demonstrated as follows.

The first full frame is quantized and stored in the storage means 50. The core computer 31 additionally stores the full frame (ID codes) in RAM 35. When the second frame is quantized, the core computer 31 compares each ID code for the second frame (new ID code) to the corresponding code stored in RAM (old ID code). If a new ID code does not differ significantly from the corresponding old ID code, the core computer 31 eliminates the old ID code and sets a tag bit. If a new ID code does differ significantly from the corresponding old ID code, the core computer 31 allows the new ID code to be stored in the storage means 50 and replaces the old ID code in RAM with the new ID code. The core computer 31 thus acts as an intraframe compressor. It is also possible to use more than two frames in the described comparison. For example, in an "n" frame comparison, a given percentage of those vectors which change the most during the "n" frame time internal may be updated.

Figure 7:
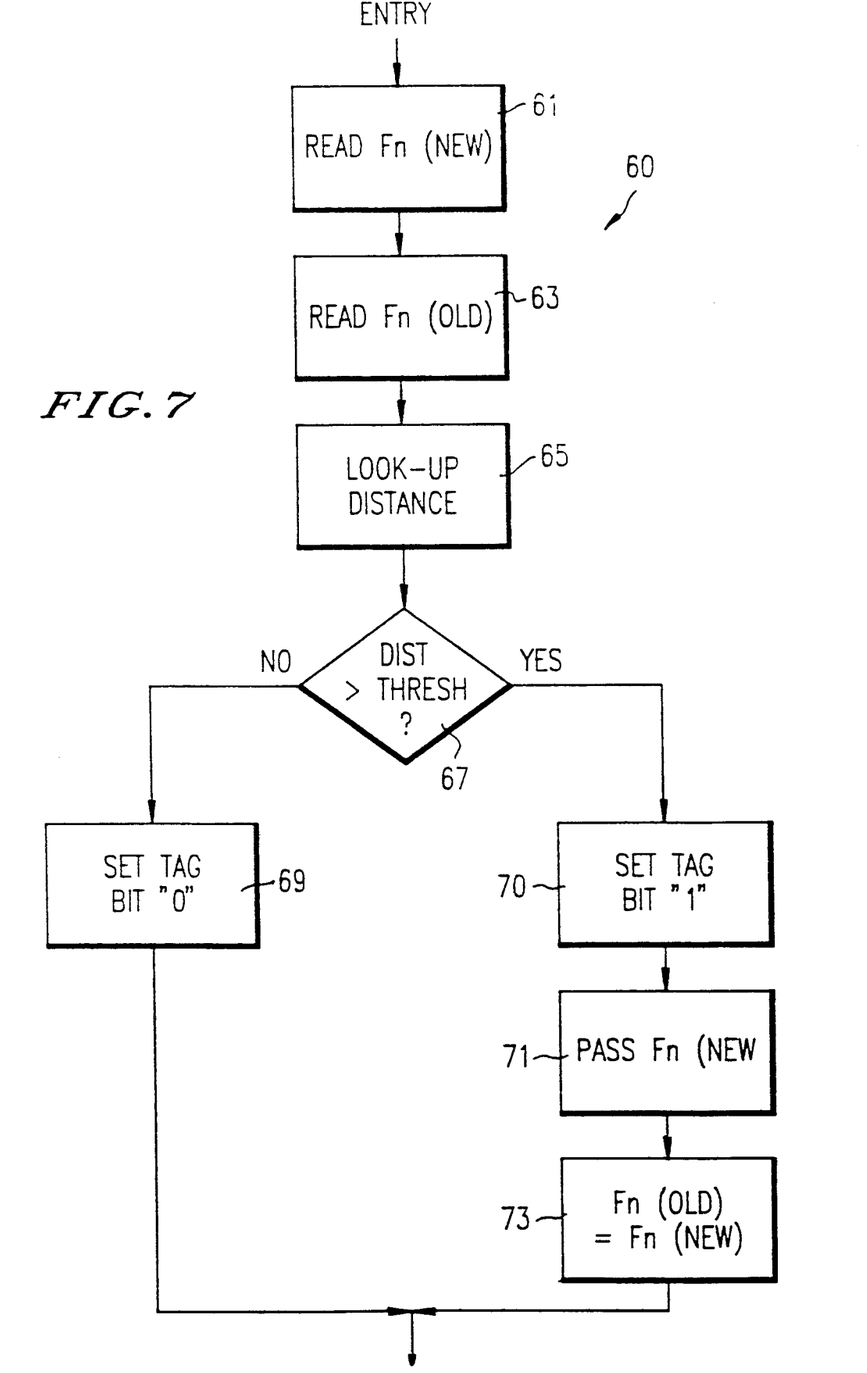
FIG. 7 is a flow chart of a process for inserting tag bits between identification codes.

FIG. 7 shows a flow chart of the process 60 for setting tag bits between ID codes. The core computer 31 first executes an input operation 61 which loads an ID code $F_n$(new) from the new frame. The core computer 31 then executes a second input operation 63 which loads the corresponding old ID code $F_n$(old) from RAM 35 (FIG. 6). The core computer 31 then executes a table look-up operation 65 to determine the distance between the new ID code $F_n$(new) and the corresponding old ID code $F_n$(old). The core computer 31 then executes a decision operation 67. If the distance "d" is less than a threshold $d_{thresh}$, the core computer 31 executes a processing operation 69 to delete the new ID code and sets a tag bit in the signal stream to "0". If the distance is greater than a threshold "d" thresh, the core computer 31 executes operations 70,71 to pass the ID code for the current frame to the storage interface 49 and sets a tag bit in the signal stream to "1". The core computer 31 also executes a processing operation 73 to replace the old ID code in RAM 35 with the new ID code. The core computer 31 then repeats the process for the next ID code in the frame.

When each subsequent frame is quantized, the core computer 31 compares each new ID code with the corresponding code stored in RAM. The RAM always contains the most recently stored ID code which was not replaced. In this way, new ID codes are sent when a new ID code represents a vector which sufficiently changed from the last sent code, even if it was sent many frames earlier.

In order to regenerate the video signal, a reverse process occurs. Referring again to FIG. 6, the first full frame of ID codes is read from the storage means 50. The decoder 51 replaces each ID code with the corresponding pixel values and passes pixel values to the display interface 53. As the first frame is read from the storage means 50, the core computer 31 also stores the ID codes from the first full frame in RAM 35.

When the second frame is retrieved from the storage means 50, fewer than a full number of ID codes has been stored. Many ID codes were eliminated. The core computer 31 monitors the sequence of ID codes and tag bits read from the storage means 50. When a "0" tag bit is detected, the core computer 31 replaces the tag bit with the corresponding ID code from RAM 35. The decoder 51 can then replace the ID code with the corresponding pixel values, and the vector can be sent to the display interface 53. The core computer 31 thus also acts as an intraframe expander.

Figure 8:
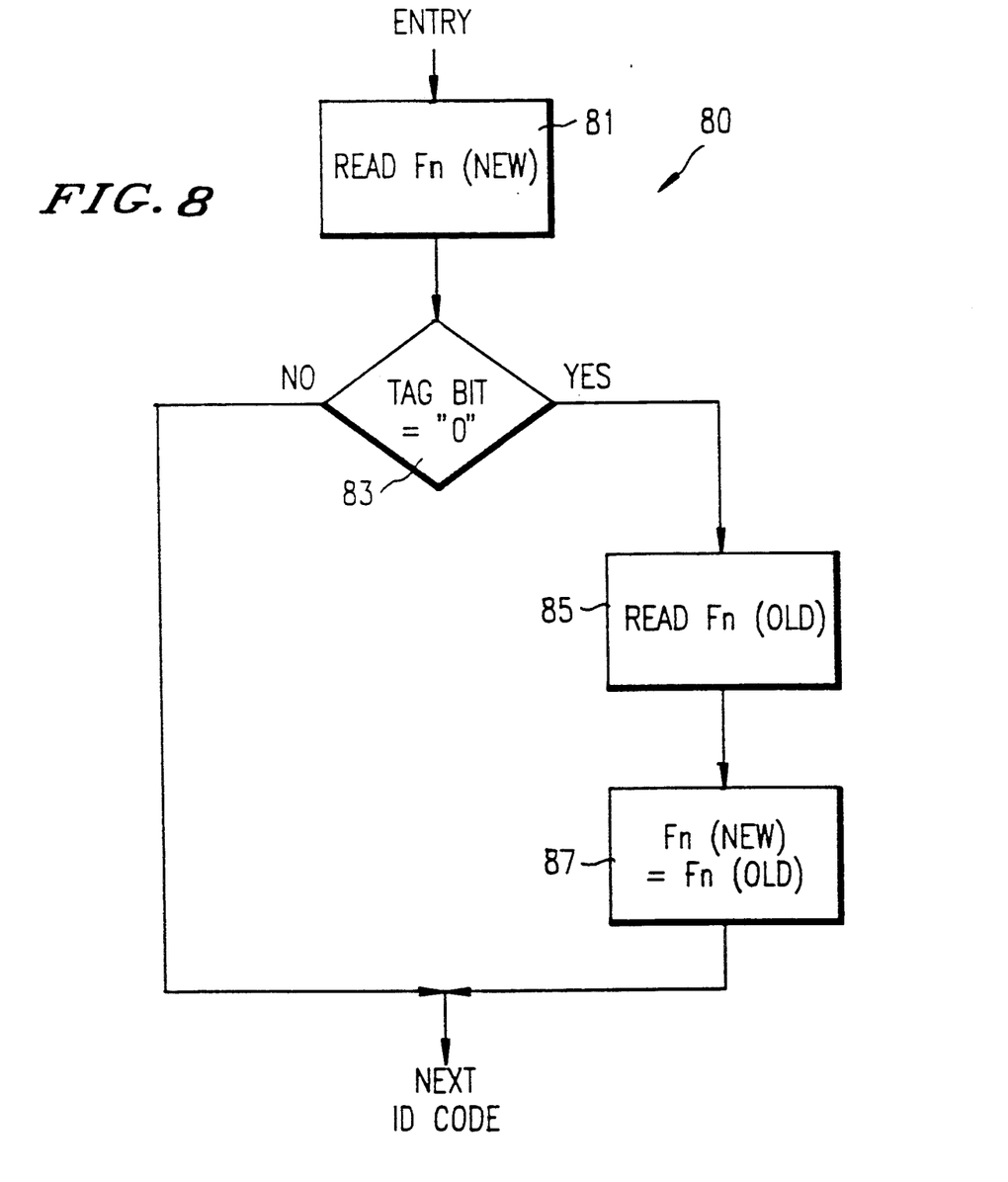
FIG. 8 is a flow chart of a process for removing tag bits between identification codes.

FIG. 8 shows a flow chart for the process 80 for restoring ID codes. The core computer 31 executes an input operation 81 to load an ID code. The core computer 31 then executes a decision operation 83. If the tag bit is a "0", the core computer 31 executes a read operation 85 to retrieve the corresponding ID code from RAM 35. The core computer 31 then executes a processing operation 87 to replace the last corresponding ID code into the signal stream. If the tag bit was not a "0", the core computer 31 takes no action. The core computer 31 then loads the next ID code in the frame and repeats the operation.

In practice, a tag bit is inserted between each ID code in the frame. If the tag bit is a "0", then the ID code has been deleted and the old ID code is reused. If the tag bit is a "1" then the following ten bits are the next ID code in the frame. If, for example, a consecutive string of five ID codes was eliminated, then a consecutive string of five "0" bits will be found in the series. The core computer 31 must maintain synchronization with the quantizer so that the core correctly distinguishes tag bits from ID codes.

In the system shown in FIG. 6, a single computer performed both the compression and expansion functions. One of ordinary skill in the art can see that the storage means (such as magnetic tape) could be transported to a second core computer, and the second core computer could be used to perform the expansion operation.

Figure 9:
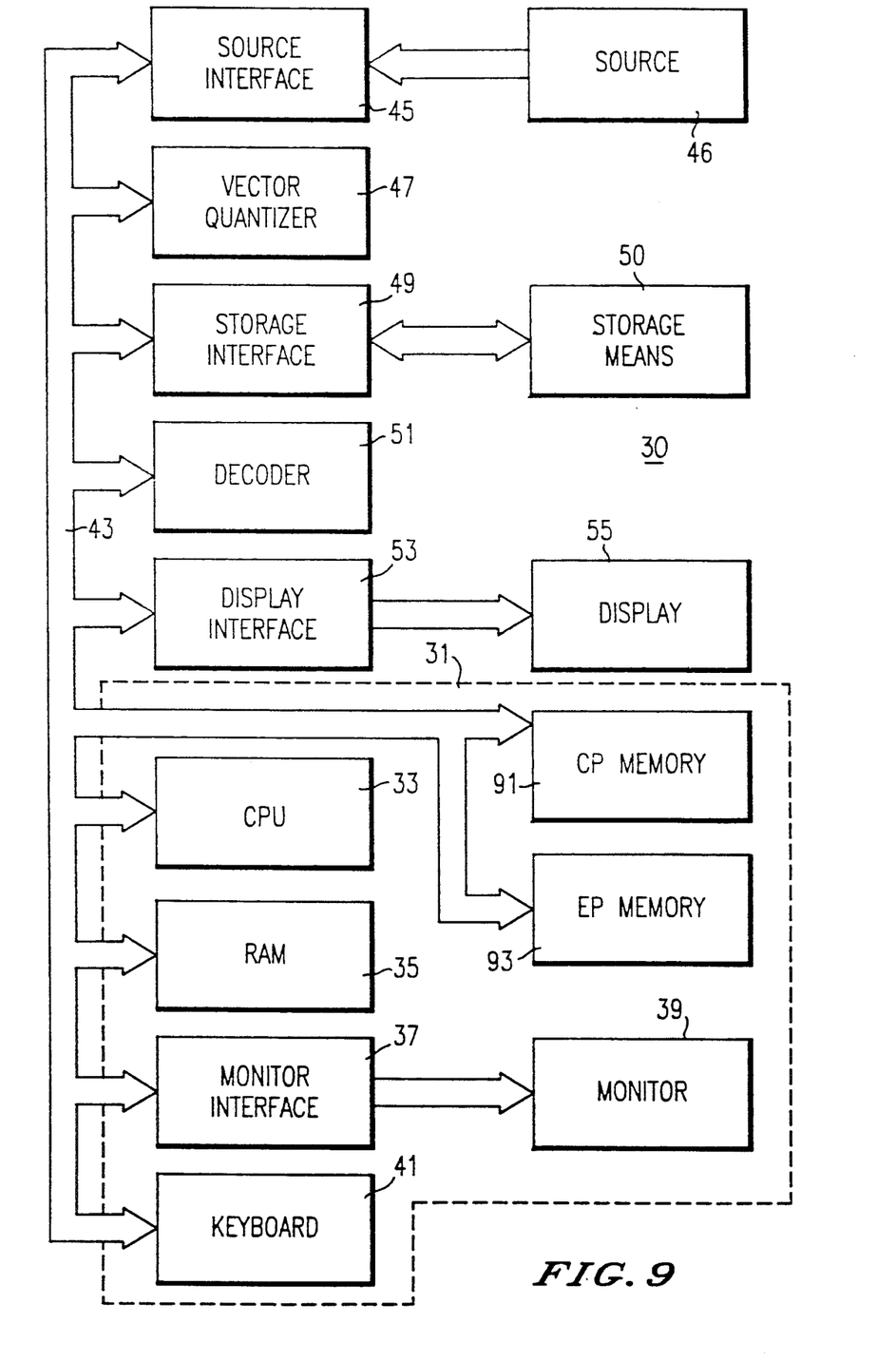
FIG. 9 is a block diagram of an alternate embodiment of a system for compressing data including program memory for post-quantization processing.

In accordance with the present invention, other forms of post processing (other than interframe compression) are possible. For example, pattern recognition, edge enhancement and detection and digital filtering may be performed in the vector space if desired. Such additional methods may be used instead of, or in addition to, interframe compression. FIG. 9 shows a generalized block diagram of a system for performing post processing on vector quantized signals. The apparatus of FIG. 9 is identical to the apparatus of FIG. 6, except that two additional program memory devices 91,93 have been added to the core computer 31. The additional memory 91,93 contains additional software for compressing and expanding operations, respectivly, as will be described below. In general operation, the vector quantizer 47 generates a compressed signal which is a series of identification codes. A block of ID codes, which may correspond to one or more frames of data, are stored as a file in the storage means 50. The core computer 31 then performs additional compression under the control of the program stored in the additional program memory PPM. The post processing can also be performed "on line," which is to say that processing can be performed as the quantizer generates identification codes.

Figure 10:
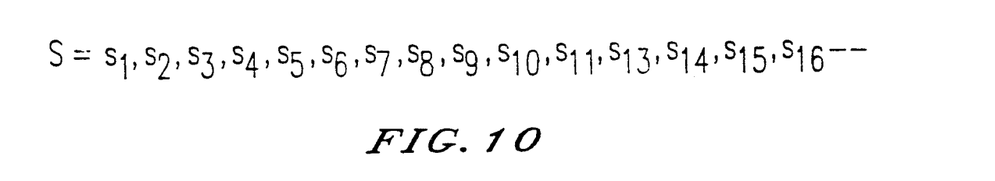
FIG. 10 is a representation of data as a series of symbols.
Figure 11:
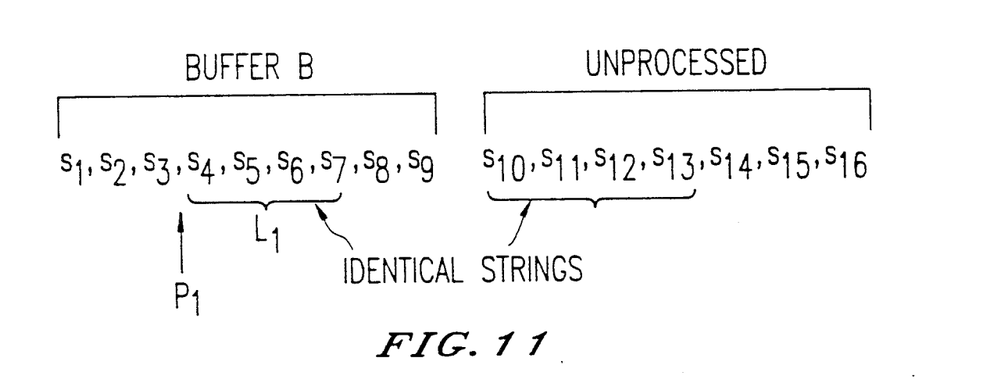
FIG. 11 is a representation of a series of symbols in which one sequence has been loaded into a buffer.
Figure 12:
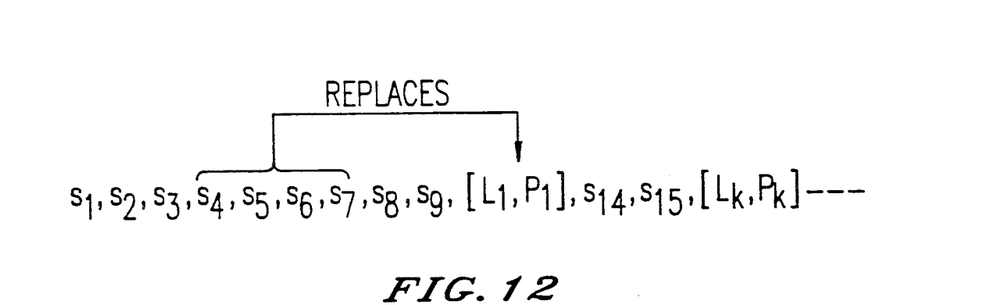
FIG. 12 is a symbolic representation of a compressed data stream.

One method for additional compression, sometimes referred to as "Lempel-Ziv" coding, utilizes a process described in an article by J. Ziv and A. Lempel entitled: "A Universal Algorithm for Sequential Data Compression", *IEEE Transactions on Information Theory*, pp 337-343, May, 1987. That article defines the process rigorously, and only a conceptual description is included here. Referring to FIG. 10, a data string S is indicated by a series of symbols $s_i$. The symbols may be a series of binary ones and zeros. To begin the process, an initial portion of data (or a series of "0" symbols) is transfered to a buffer. FIG. 11 shows the first nine symbols $s_1, s_2, s_3, s_4, s_5, s_6, s_7, s_8, s_9$ transfered to a buffer B and the remaining stream of symbols $s_{10}, s_{11}$, etc. are shown as unprocessed. The process attempts to identify a series of symbols $s_i, \ldots, s_j$ in the buffer B which is identical to a string of unprocessed symbols $s_{10}, \ldots$. For example, the string $s_4, s_5, s_6, s_7$ might be identical to the string $s_{10}, s_{11}, s_{12}, s_{13}$. When such a match is found, the process generates an output consisting of a pointer address P which indicates the point in the buffer where the matching series begins. The process also outputs a code L indicating the length of the matched series $s_{10}, s_{11}, s_{12}, s_{13}$. The matched series $s_{10}, s_{11}, s_{12}, s_{13}$ is then shifted into the buffer B, and the process is repeated. FIG. 12 shows an algebraic representation of the output signal. Compression is achieved if the number of symbols needed to identify a pointer address P and length code L is less than the number of symbols removed from the string S.

An expansion process (not shown) regenerates the original data S by the reverse process. That is to say, an expansion process loads the initial sequence $s_1, \ldots, s_9$ into a buffer, and then replaces pointer address and length codes with symbols from the buffer.

Another method, sometimes referred to as "Huffman coding" utilizes codes of varying lengths. Short codes are assigned to more frequently selected codebook vectors, and longer codes are assigned to less frequently selected codebook vectors. The assignment of ID codes may be determined at the time the codebook set is formed, or the assignment may vary adaptively. Methods for Huffman coding are well known, and described in a book by J.A. Stores entitled *Data Compression Methods and Theory*, Computer Science Press, Rockville, Md., 1988, pp. 39-45.

The apparatus of FIGS. 6 and 9 can also be adapted to transmit compressed data rather than store it. Modular replacement of the storage interface and the storage means with a communications interface and a communications channel, respectively, can readily be accomplished by one of ordinary skill in the art of data processing.

While the invention has been described in connection with specific embodiments thereof, it will be understood that it is capable of further modifications. This application is intended to cover any variations, uses or adaptations of the invention, and including such departures from the present disclosure as come within known and customary practice within the art to which the invention pertains.

What is claimed is:

1. A method for compressing data for use with a codebook of vectors, the method comprising the steps of:
   (a) arranging the data into a plurality of discrete frames;
   (b) vector quantizing each of said data frames; and
   (c) performing post-quantization compression on the vector quantized data, said post-quantization compression comprising representation of differences between adjacent frames.

2. A method in accordance with claim 1 wherein the step of interframe compression comprises the steps of:
   (a) organizing the data into an ordered series of input vectors and organizing the vectors into at least two frames such that a vector from any frame has a logical correspondence to a vector from each preceeding frame,
   (b) generating identification codes of codebook vectors which closely match the input vectors,
   (c) modifying a vector ID code if its distortion relative to the corresponding vector in a prior frame is less than a threshold amount.

3. A method in accordance with claim 2 further comprising the step of: setting a code in a frame, said code indicating the position in the frame where an identification code has been modified.

4. A method in accordance with claim 2 wherein the step of modifying a vector comprises the steps of:
   (a) performing a table look-up of distances from a table based in identification code,
   (b) comparing the distance to a threshold, and
   (c) eliminating the identification code from the frame if the distance is less than a threshold.

5. A method in accordance with claim 2 wherein the step of generating identification codes comprises the steps of:
   (a) indentifying a reference codebook vector, $A_j$, which satisfies a first criterion,
   (b) identifying a subset, S, of codebook vectors for which the distance between the reference codebook vector, $A_j$, and each codebook vector of the subset S satisfies a second criterion,
   (c) selecting a codebook vector from the subset S which closely matches the input vector.

6. A method in accordance with claim 2 wherein the step of generating identification codes comprises the steps of:
   (a) simultaneously computing distance values between an input vector and a plurality of codebook vectors, and
   (b) identifying the smallest distance value.

7. An apparatus for use with a codebook of vectors for compressing data comprising:
   (a) interface means responsive to the data for organizing the data into an ordered series of vectors and for organizing the vectors into at least two frames such that a vector from a succeeding frame has a logical correspondence to a vector from a preceeding frame,
   (b) vector quantizer means responsive to the series of input vectors for generating identification codes of codebook vectors which closely match the input vectors, and
   (c) interframe compressor means responsive to the frames of identification codes for modifying a vector ID code if its distortion relative to the corresponding vector in a prior frame is less than a threshold amount.

8. An apparatus in accordance with claim 7 wherein the interframe compressor means additionally inserts a code into a frame, said code indicating the position in the frame where an identification code has been modified.

9. An apparatus in accordance with claim 7 further comprising: storage means responsive to the interframe compressor means for storing a table of vector distances between codebook vectors and for indicating to the interframe compressor the distances between codebook vectors.

10. A system for use with a codebook of vectors and input vectors for compressing and restoring data comprising:
   (a) vector quantizer means responsive to the input vectors for generating identification codes of codebook vectors which closely match the input vectors,
   (b) interframe compression means responsive to the frames of identification codes for modifying a vector ID code if the vector's distortion relative to the corresponding vector in a prior frame is less than a threshold amount,
   (c) interframe expansion means responsive to the interframe compression means for restoring identification codes which had been modified by the interframe compression means,
   (d) decoder means responsive to the regenerated frames of identification codes for regenerating frames of data.

11. A system in accordance with claim 10 wherein the interframe compressor means comprises means for setting a code in a frame, said code providing an indication as to the position in the frame where an identification code has been modified.

12. A system in accordance with claim 10 further comprising: storage means responsive to the interframe compressor means for storing a table of vector distances between codebook vectors and for indicating to the interframe compressor the distances between codebook vectors.

13. A system in accordance with claim 10 further comprising: storage means responsive to the interframe compression means for receiving frames of identification codes from the interframe compression mean at one time and for regenerating frames of identification codes at another time.

14. A system in accordance with claim 10 further comprising: communication means responsive to the interframe compression means for communicating frames of identification codes from the interframe compression means to the interframe expansion means.

15. A method for use with a codebook of vectors for compressing data comprising the steps of:
   (a) expressing the data as a series of identification codes of closely matching codebook vectors, each identification code comprising a string of one or more symbols,
   (b) for a first sequence of symbols in the series of symbols, identifying a second sequence of symbols which is identical to the first sequence and which precedes the first sequence in the series,
   (c) representing the first sequence with a code which indicates the position of the second sequence in the series of symbols.

16. A method in accordance with claim 15 wherein the step of expressing the data as a series of identification codes includes the steps of:
   (a) indentifying a reference codebook vector, $A_j$, which satisfies a first criterion,
   (b) identifying a subset, S, of codebook vectors for which the distance between the reference codebook vector, $A_j$, and each codebook vector of the subset S satisfies a second criterion,
   (c) selecting a codebook vector from the subset S which closely matches the input vector.

17. A method in accordance with claim 15 wherein the step of expressing the data as a series of identification codes includes the steps of:
   (a) simultaneously computing distance values between an input vector and a plurality of codebook vectors, and
   (b) identifying the smallest distance value.

18. A method for compressing data for use with a codebook of vectors, the method comprising the steps of:
   (a) arranging the data into at least two frames;
   (b) expressing the data as a series of input vectors;
   (c) identifying codebook vectors which closely match the input vectors; and
   (d) representing each frame as a series of identification codes of closely matching codebook vectors, said identification codes being selected such that the identification code of a more frequently identified codebook vector is shorter than the identification code of a less frequently identified codebook vector, wherein said codebook vector identification step comprises the steps of:
      (i) identifying a reference codebook vector, $A_j$, which satisfies a first criterion;
      (ii) identifying a subset, S, of codebook vectors for which the distance between the reference codebook vector, $A_j$, and each codebook vector of the subset S satisfies a second criterion; and
      (iii) selecting a codebook vector from the subset S which closely matches the input vector.

19. A method for compressing data for use with a codebook of vectors, the method comprising the steps of:
   (a) arranging the data into at least two frames;
   (b) expressing the data as a series of input vectors;
   (c) identifying codebook vectors which closely match the input vectors; and
   (d) representing each frame as a series of identification codes of closely matching codebook vectors, said identification codes being selected such that the identification code of a more frequently identified codebook vector is shorter than the identification code of a less frequently identified codebook vector, wherein said codebook vector identification step comprises the steps of:
      (i) simultaneously computing distance values between an input vector and a plurality of codebook vectors; and
      (ii) identifying the smallest distance value.

* * * * *